United States Patent [19]
Lam et al.

[11] Patent Number: 4,731,758
[45] Date of Patent: Mar. 15, 1988

[54] DUAL ARRAY MEMORY WITH INTER-ARRAY BI-DIRECTIONAL DATA TRANSFER

[75] Inventors: Heng-Mun Lam; Paul D. Keswick, both of San Jose, Calif.

[73] Assignee: Advanced Micro Devices, Inc., Sunnyvale, Calif.

[21] Appl. No.: 747,475

[22] Filed: Jun. 21, 1985

[51] Int. Cl.$^4$ ................................................ G11C 7/00
[52] U.S. Cl. ...................................... 365/189; 365/203
[58] Field of Search ............... 365/189, 200, 203, 221, 365/230

[56] References Cited

U.S. PATENT DOCUMENTS

| | | | |
|---|---|---|---|
| 3,685,020 | 8/1972 | Meade | 365/230 |
| 4,106,910 | 8/1978 | Fassbender | 365/221 |
| 4,347,587 | 8/1982 | Rao | 365/221 |

Primary Examiner—Terrell W. Fears
Assistant Examiner—Melissa J. Koval
Attorney, Agent, or Firm—Patrick T. King; Stephen C. Durant

[57] ABSTRACT

A high access speed memory for the internal storage of data and the addressable input/output transfer of data thereto, the memory comprising means for the dynamic storage of data, means for the static storage of data, and means for transferring data between the dynamic storage means and the static storage means. The intimate interfacing of the static and dynamic memories provides a high access speed pathway to the dynamically stored data while impacting minimally on sense amplification timing and the use of a redundant dynamic memory scheme.

16 Claims, 4 Drawing Figures

DUAL ARRAY MEMORY WITH INTER-ARRAY BI-DIRECTIONAL DATA TRANSFER

FIELD OF THE INVENTION

The present invention generally relates to random access memory (RAM) used in high speed computer systems and, in particular, to a high access speed memory utilizing dynamic RAM to provide high data storage capacity and static RAM to provide a bi-directional high speed access path to the dynamic RAM stored data.

BACKGROUND OF THE INVENTION

The designers of all forms and classes of computer systems have commonly exhibited the desire to implement higher speed systems having ever increasing amounts of immediately available random access memory. The desire for increased speed is a reflection of a number of interrelated factors, including increased computer instruction complexity, the length and complexity of application programs, and the shear quantity of data to be managed and transformed in the execution of application programs. Naturally, the immediately accessible random access memory of such systems must also have high access speed as well as the capability of storing a high capacity or density of data. This is required to ensure that data access is not the limiting factor in the performance of the overall computer system.

Certain applications, such as high resolution digital video graphics, place heightened requirements on the level of data densities and access speeds necessary to adequately accomplish their goal or function. In digital video graphics, the high densities of data are required to accurately represent the digital graphic video images. However, as the level of data utilized increases, the access speed to any particular datum must correspondingly increase to permit adequate manipulation of the image data. Further, the time period allowed for accessing and manipulating image data is severly constrained to non-screen refresh periods. Typically, such non-screen refresh periods amount to only 13% of any image access period.

In most instances where high capacity semiconductor memories are required, the use of dynamic RAM is prevalent due to its cost effectiveness. As with most digital semiconductor technologies, there have and continue to be improvements, including increasing the data density and access speed of dynamic RAM memories. Unfortunately, these continuing improvements occur only in small increments. Naturally, a substantial increase in either the data density storage capability or access speed, or preferably both, is highly desirable.

One reason for achieving only incremental increases in the data density and access speed of dynamic RAM memories is that any modification must be considered in light of all of the constraints on a dynamic memory system. In particular, such modifications must be considered in terms of their impact on, for example, the sensitive dynamic RAM sensing scheme utilized. Further, as the data density increases the need for provide for memory cell redundancy similarly increases. Any modification to enhance access speed must take into account not only the povision of redundant memory cells, but the additional routing circuitry necessary to effect the replacement of defective memory cells with their redundant counterparts. Additionally, all such modifications, as a practical matter, need be implemented so as to provide the least burden upon a designer of memory systems to obtain full benefit of the memory speed and data density enhancements in the completed system.

SUMMARY

A principal purpose of the present invention is, therefore, to provide a high data density random access memory having a substantially improved data access speed.

This is accomplished in the present invention by providing a high access speed memory for the internal storage of data and the addressable input/output of data thereto, the memory comprising means for the dynamic storage of data, means for static storage of data, and means for transferring data between the dynamic storage means and the static storage means so as to permit the data stored in the dynamic storage means to be accessible through the static storage means.

An advantage of the present invention is that it permits the bidirectional transfer of data between the dynamic and static RAM so as to effectively provide the high data capacity DRAM with a high access speed pathway.

A further advantage of the present invention is that the interconnection between the dynamic and static RAM eliminates all DC current paths thereinbetween during data transfer so as to have an extremely low power requirement for effecting data transfer and, further, is readily adaptable to implementation in CMOS integrated circuitry.

Another advantage of the present invention is that it allows independent operation of both the static and dynamic RAM during all non-transfer timing cycles and the non-transfer portions of the data transfer cycle by providing for the total disconnection of the dynamic RAM from the static RAM, except during the actual data transfer cycle portion.

Yet another advantage of the present invention is that its implementation does not or only minimally impacts on the dynamic RAM sensing and refresh timing schemes while readily allowing for the provision of dynamic RAM redundancy.

A still further advantage of the present invention is that it may be readily implemented to provide high speed serial access to the dynamic RAM memory in a manner quite appropriate for use in high data capacity digital video graphic systems and buffers.

BRIEF DESCRIPTION OF THE DRAWINGS

These and other attendant advantages of the present invention will become apparent and readily appreciated as the same becomes better understood by reference to the following detailed description of the invention when considered in connection with the accompanying drawings wherein.

DETAILED DESCRIPTION OF THE INVENTION

Figure 1:
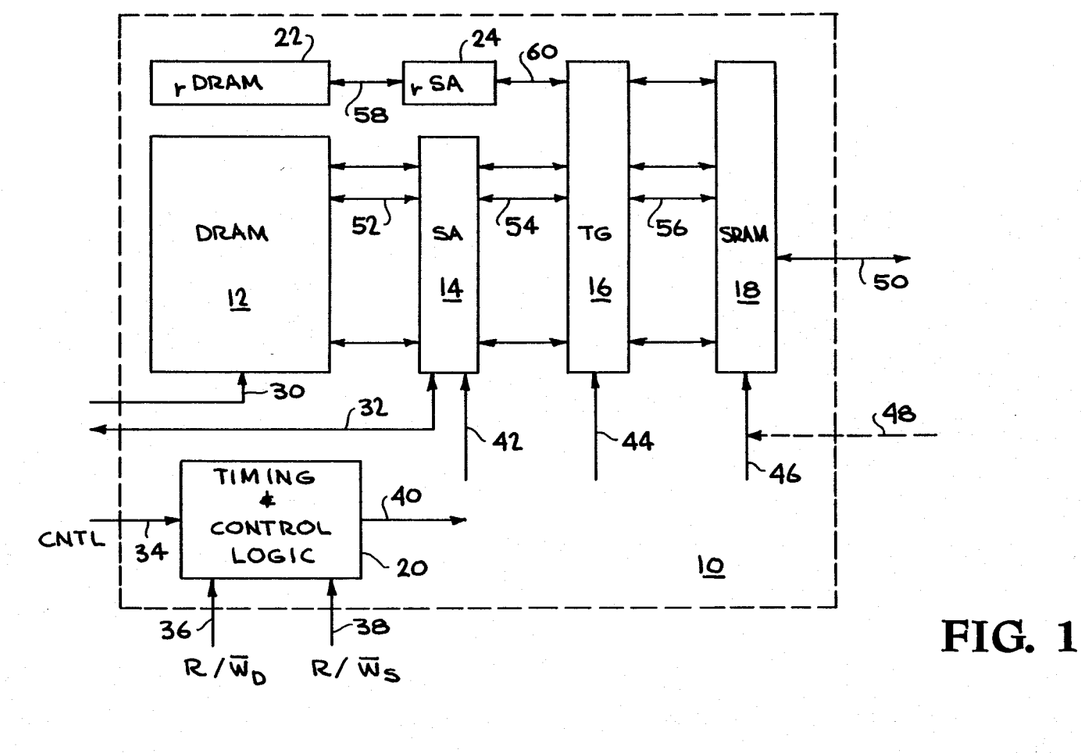
FIG. 1 provides a simplified block diagram of a preferredd dual array static RAM/dynamic RAM memory constructed in accordance with the present invention.

A preferred dual array static/dynamic random access memory (S/DRAM) 10 is shown in FIG. 1. The S/DRAM 10 includes a substantially conventional dynamic random access memory (DRAM) array 12 that provides high capacity storage of data. A similarly conventional sense amplifier array 14 is provided to communicate data to and from the DRAM array 12 via the sense amplifier bit lines 52; each bit line 52 corresponding to a row or preferably column of the DRAM array 12. Also associated with the DRAM array 12 and sense amplifier array 14 is a redundant DRAM array 22 and corresponding redundant sense amplifier 24. Redundant sense amplifier bit line 58 is provided to communicate data between the redundant DRAM array 22 and redundant sense amplifier 24. Data addresses are communicated to the DRAM array 12 via the DRAM address bus 30 while DRAM data bus 32 communicates data between the sense amplifier array 14 and the external interface of the S/DRAM 10. Together, the DRAM address bus 30 and data bus 32 form a first data access pathway, or port, to the data stored in the dram array 12.

In accordance with a preferred embodiment of the present invention, a transfer gate array 16 and corresponding static random access memory (SRAM) array 18 are provided to establish a second bidirectional access pathway to the data stored in the DRAM array 12. With the provision of a transfer gate enable signal $\phi_{TRD}$ on a control line 44, data is permitted to communicate between the sense amplifier array 14 and SRAM array 18 via the respective transfer gate bit lines 54 and SRAM bit lines 56. Data stored in the SRAM array 18, in turn, may be accessed via the SRAM address bus 46 and data bus 50; the same constituting the second port of the S/DRAM 10.

Finally, a timing and control logic block 20 is provided within the S/DRAM 10 to provide the appropriate timing and control signals on control lines 40 to effectively coordinate the dual array access to the data stored in the DRAM array 12. These timing and control signals are generated in response to conventional external timing and control signals provided on lines 34 and, in particular, the DRAM and SRAM read/write signals provided on the respective R/$\overline{W}$ control lines 36, 38.

The timing and control logic block 20 is preferably a state machine dedicated to supervise the direct access of data within the DRAM array 12 via the DRAM data bus 32, the bidirectional transfer of data with the SRAM 18 via the transfer gate array 16 and the access of data within the SRAM array 18 via the SRAM data bus 50. The timing and control block 20 preferably also contains circuitry that effects the incorporation of the redundant DRAM array 22 into the DRAM array 12 so to provide for the effective elimination of any defective DRAM memory cells. Typically, this is accomplished by remapping the contiguous address space of the DRAM array 12 to include the redundant array 22 and to exclude the corresponding defective portion of the original DRAM array 12. Conventional redundancy schemes, as preferred in conjunction with the present invention, provide for the similar incorporation of the redundant sense amplifier 24 in a corresponding location within the sense amplifier array 14. However, for reasons to be described in greater detail below, the redundant sense amplifier 24 is preferably connected, in a dedicated manner, only to a single, additional transfer gate in the gate array 16 by the transfer gate bit line 60.

In a preferred embodiment, the timing and control logic block 20 of the present invention preferably generates and provides the SRAM addresses on the SRAM address bus 46. By generating sequential addresses, the SRAM array 18 is made to function as the equivalent of a shift register. That is, where the SRAM array 18 is composed of, for example, a bit linear array of SRAM cells, data to or from the SRAM array 18 will be transferred over the SRAM data bus 50 as a bit serial stream corresponding to the serial sequence of generated addresses. In this manner, a substantial access speed enhancement is effectively realized over the DRAM array parallel transfers of data between the DRAM array 12 and SRAM array 18; accesses of the DRAM array 12 requiring approximately 190 ns while the SRAM array 18 typically requires 40 ns to access. This speed enhancement is effectively achieved while also effectively providing that required high speed serialized data stream required, for example, in raster scan digital graphics applications. Naturally, the bit width of the serialized data stream from the SRAM array 18 may be increased by simply paralleling identical S/DRAMS 10 or by internally implementing the DRAM and SRAM arrays 12, 18 as nibble, byte or word linear arrays. Preferably, such higher bit width linear SRAM arrays 18 are mirrored by a corresponding increase in the word length of the DRAM array 12, sense amplifier array 14, and transfer gate array 16. For example, a preferred embodiment of the present invention provides for a DRAM array 12 organized as four bit-planes, each containing 256 columns of 256 dynamic memory cells, for a combined capacity of 256K bit. The sense amplifier array 14 is correspondingly organized as four bit planes of 256 amplifiers. Similarly, four bit-planes, respectively, of 256 bit transfer gates in the transfer gate array 16 are provided to match a four bit wide SRAM array 18 having a linear length of 256 memory cells, excluding allocations for DRAM array redundancy.

A particular advantage of the present invention is that little additional circuitry is required to accommodate DRAM array redundancy. By generating the SRAM addresses internal to S/DRAM 10, the timing and control logic block 20 needs only to additionally modify its SRAM address counter sequence to adjust for the use of redundancy in effecting a contiguous address space DRAM array 12. That is, the address count sequence produced by the timing and control logic block 20 and provided on the address bus 46 need only sequentially step through the addresses of the SRAM array 18 up to the SRAM cell or cells correspondingly to defective memory cells within the DRAM array 12, then next provide the SRAM address corresponding ultimately to the redundancy sense amplifier 24 and, thereafter, resume the SRAM array 18 sequential address generation. In this manner, access of the DRAM array 12 through the SRAM array 18 is independent of the particular scheme or utilization, if at all, of redundancy without impacting on the design decisions relating to the provision of redundancy.

An alternative embodiment of the present invention is contemplated wherein the addresses applied to the SRAM array 18 may be independently generated external to the S/DRAM 10 in a conventional manner and provided thereto by an address bus extension 48. In such embodiments, it is preferred that redundant DRAM address mapping circuitry similarly provide for a remapping of the SRAM memory cells associated with the redundant sense amplifiers 24 so as to provide a contiguous SRAM address space that identically matches that of the DRAM array 12. The particular advantage of this embodiment is that all memory accesses of the S/DRAM 10 within its linear width can be accomplished at the available access speed of the SRAM array 18 as may be desired in prefetching and cache type computer memory systems.

Figure 2:
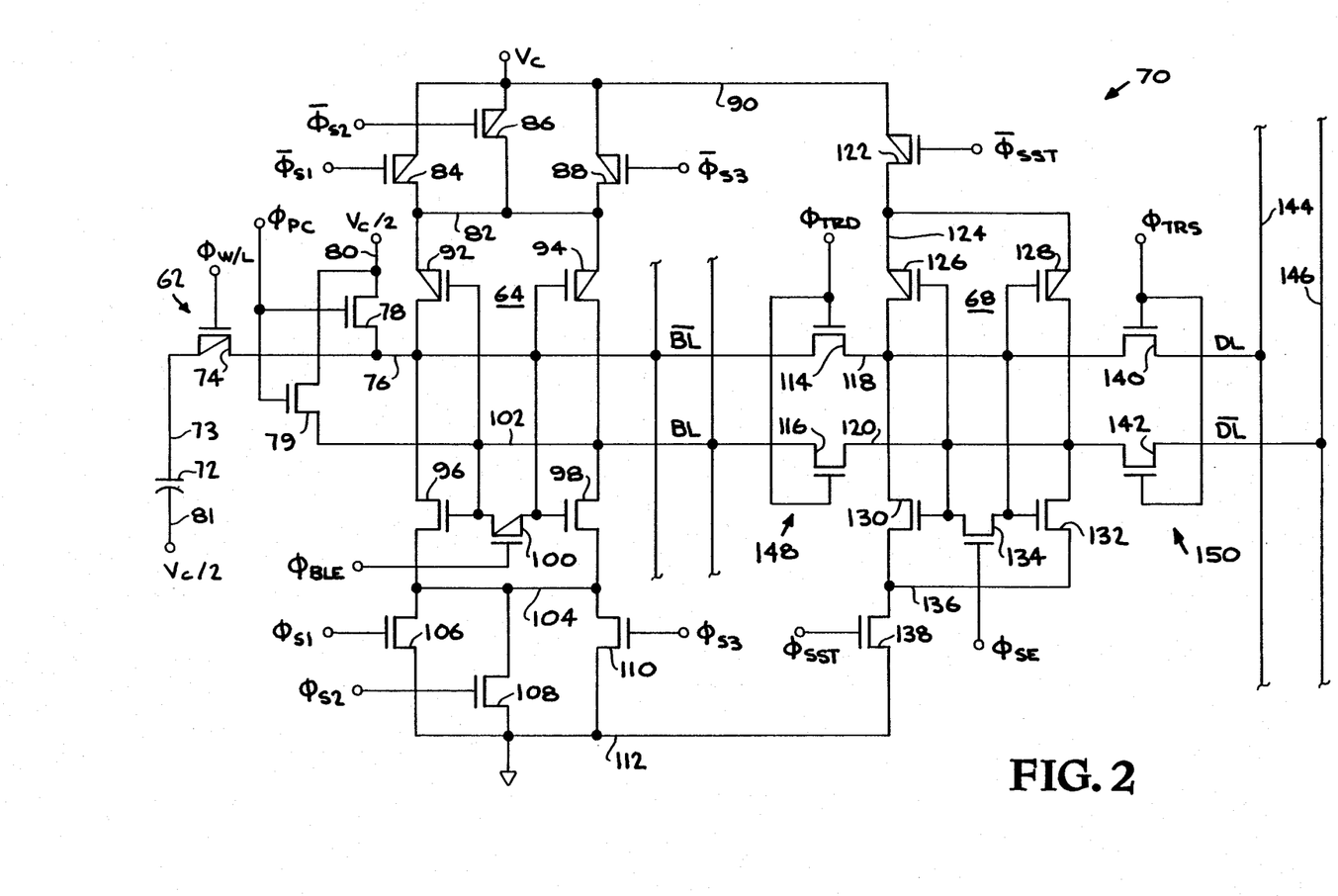
FIG. 2 provides a detailed circuit schematic of exemplary dynamic RAM and static RAM memory cells constructed and interconnected in accordance with a preferred embodiment of the present invention.

Referring now to FIG. 2 there is shown an exemplary circuit schematic of a DRAM memory cell 62, its associated sense amplifier 64, a transfer gate 148 and a SRAM memory cell 68. The DRAM memory cell 62 is fundamentally composed of the storage capacitor 72 connected between its word line 73 and a reference potential line 81 preferably having a voltage potential of $V_c/2$. Selection of the word line 73 is accomplished by the provision of the wordline enable signal $\phi_{W/L}$ on the gate of word line select transistor 74, thereby transferring the word line datum onto the sense amplifier bit line 76.

The sense amplifier 64 includes a latch portion formed by transistors 92, 94, 96, 98 and activating or sensing transistors 84, 86, 88, 106, 108, 110. Preferably, the latch transistors 92, 94, 96, 98 are cross-coupled substantially in the manner shown, between high and low rails 82, 104, to provide bistable latch operation. That is, preferably transistors 92, 94 are P-type enhancement transistors while transistors 96, 98 are N-type enhancement so that, when active, transistors 92 and 94 are in complementary conductive states relative to their respective latch side transistors 96, 98 as well as one another. Thus, the operation of the latch provides that the sense amplifier bit lines 76, 102 are latched into opposing logic states when the sense amplifier 64 is active.

Activation of the sense amplifier is preferably performed by a 3-step sequencing of the sensing transistors 84, 86, 88, each coupled between the $V_c$ voltage line 90 and latch high rail 82, and sensing transistors 106, 108, 110, each coupled between the latch low rail 104 and the ground reference line 112. Due to the small charge storage capacity of the DRAM memory capacitor 72, the latch portion of the sense amplifier 64 is preferably incrementally activated by sequentially providing the $\phi_{s1}$ and $\bar{\phi}_{s1}$ signals to the respective sense transistors 106, 84. The current conductivity of sensing transistors 84, 106 is preferably of comparable magnitude to the charge storage capacity of the capacitor 72 to prevent completely overwhelming the level of charge stored on the capacitor 72. In this manner, the presence or absence of charge on capacitor 72 influences the relative voltage potentials of the bit lines 76, 102, thereby controlling the ultimate latch state of the sense amplifier 64. The sequenced activation of the sense amplifier latch then rapidly progresses with the respective application of the $\phi_{s2}$ and $\bar{\phi}_{s2}$ signals to transistors 108, 86 followed by the respective application of $\phi_{s3}$ and $\bar{\phi}_{s3}$ signals to transistors 110, 88. The resulting effective channel conductivity of the sense transistors is thus progressively increased with the resulting hard latching of the data state stored by the DRAM memory capacitor 72.

Precharge and bit line equalization transistors 78, 100 are provided to prepare the sense amplifier 64 for reading data stored by the DRAM cell 62. The precharge transistors 78, 79 coupled between a reference voltage $V_c/2$ and the sense amplifier bit lines 76, 102, respectively, permit the sense amplifier bit lines 76, 102 to be precharged in response to the application of a precharge signal $\phi_{PC}$ provided on the common connected gates of transistors 78, 79. A bit line equalization signal, $\phi_{BLE}$, is preferably applied to the gate of transistor 100 to permit selective connection in common of the sense amplifier bit lines 76, 102. The equalization transistor 100 thus ensures identical precharging of both bit lines 76, 102.

Transfer gate transistors 114, 116 are provided to interconnect the respective bit lines 76, 102 and 118, 120 of the sense amplifier 64 and SRAM cell 68. The SRAM cell 68 includes a latch portion formed by the transistors 126, 128, 130, 140 interconnected substantially as shown so as to provide a bistable latch. Again, the latch transistors 126 and 128 are preferably P-type enhancement mode transistors while transistors 130, 132 are N-type enhancement mode transistors. Consequently, by their mutual interconnection, latch transistors 126, 128 will be in conducting or non-conducting states opposite that of their respective latch side transistors 130, 132, as well as one another.

In accordance with the present invention, SRAM latch activation transistors 122, 138 are provided to selectively connect the high and low latch rails 122, 136 of the latch to respective $V_c$ voltage and ground reference lines 90, 112. Thus, by application of the $\phi_{sst}$ and $\bar{\phi}_{sst}$ signals to the SRAM latch activation transistors 138, 122, the latch of the SRAM cell 68 can be readily activated or released. Also in accordance with the present invention, a SRAM equalization transistor 134 is provided to selectably interconnect the SRAM bit-lines 118, 120 in response to the $\phi_{SE}$ signal. Thus, when the SRAM cell 68 is inactivated by the appropriate application of the $\phi_{sst}$ and $\bar{\phi}_{sst}$ signals, the $\phi_{SE}$ signal can be applied to the SRAM equalization transistor 134 to equalize the charge distribution on the SRAM bit-lines 118, 120, thereby effectively eradicating any storage of data.

Finally, for purposes of completeness, SRAM transfer gate transistors 140, 142 are shown providing respective interconnection between the SRAM bit-lines 118, 120 and the data lines 144, 146; enablement of the transfer gate transistors 140, 142 being selectable in response to a SRAM cell transfer signal $\phi_{TRS}$.

Figure 3A:
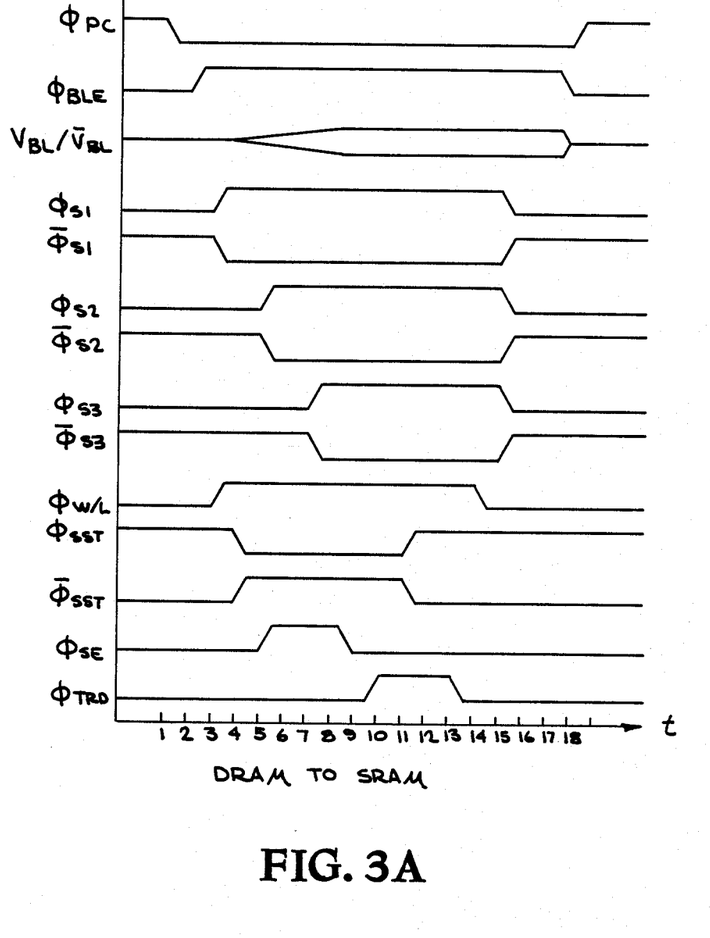
FIGS. 3a and 3b provide the timing diagrams illustrating the respective dynamic to static RAM and static to dynamic RAM data transfers as they occur in the preferred operation of the RAM circuit illustrated in FIG. 2.
Figure 3B:
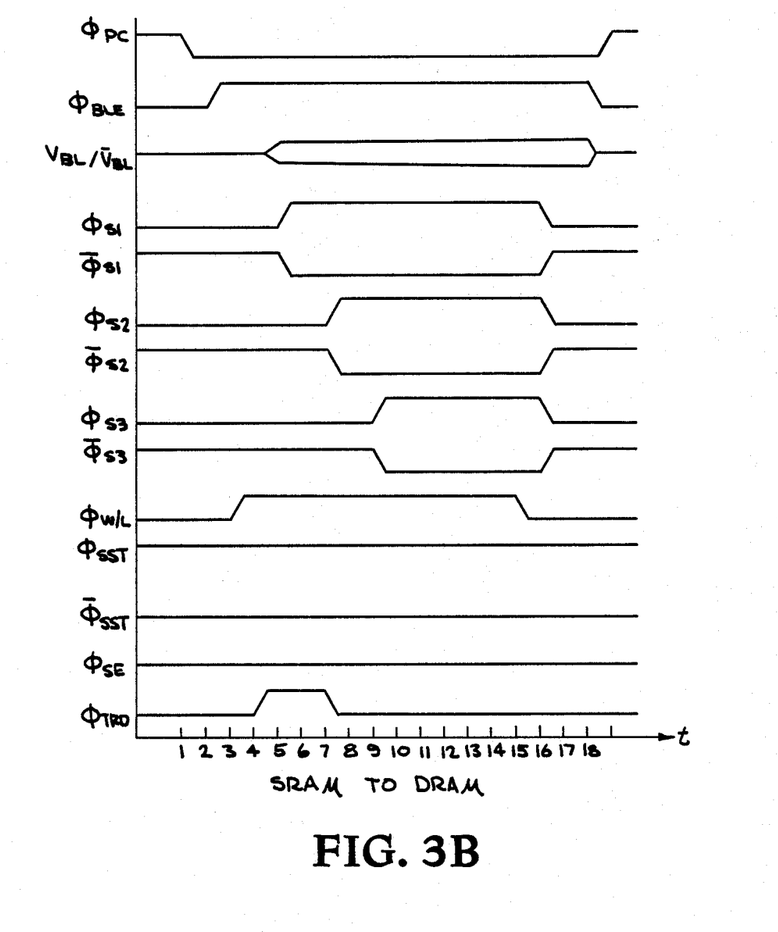

The operation of the exemplary circuit 70 of FIG. 2 is best investigated in conjunction with the timing diagrams of FIGS. 3a and b. FIG. 3a provides the timing diagram for the operation of the exemplary circuit 70 in performing a data transfer from the DRAM memory cell capacitor 72 to the SRAM memory cell, whereupon the transferred datum is available for access via the data lines 144, 146 by way of the transfer gate transistors 140, 142. Prior to time interval 1, the states of $\phi_{W/L}$ and $\phi_{s1}, \bar{\phi}_{s1}, \phi_{s2}, \bar{\phi}_{s2}, \phi_{s3}$ and $\bar{\phi}_{s3}$ are such that their respective sensing transistors 74, 106, 84, 108, 86, 110, 88 are in nonconducting states. Additionally, the transfer gate transistors 114, 116 are preferably in non-conducting states in response to the application of $\phi_{TRD}$, providing for the total electrical disconnection of the sense amplifier 64 from the SRAM memory cell 68. Assuming that the DRAM memory cell capacitor 72 has been provided with charge or the absence of charge corresponding to a valid logic state, $\phi_{PC}$ is withdrawn during time interval 1 from precharge transistor 78 to release the sense amplifier bit line 76 from being forced to the reference potential $V_c/2$. During time interval 2, $\phi_{BLE}$ is withdrawn placing the equalization transistor 100 in a nonconducting state whereby both sense amplifier bit-lines 76, 102 have been precharged, yet left floating.

During approximately time interval 3, the initial step in sensing the logic state of the DRAM memory cell capacitor 72 commences. Signal $\phi_{W/L}$ is applied to the word line transistor 74 to communicate the data stored on the capacitor 72 to the sense amplifier bit-line 76 while signals $\phi_{s1}$ and $\overline{\phi_{s1}}$ are applied to their respective sense transistors 106, 84. Although the charge storage capacity of the capacitor 72 is quite small, it is sufficient to support an approximately 60 millivolt voltage on the sense ammplifier bitline 76 relative to the complementary sense amplifier bit-line 102. Thus, as indicated n FIG. 3a a voltage potential difference $V_{BL}/\overline{V}_{BL}$ begins to develop.

During approximately time interval 4, the $\phi_{sst}$ and $\overline{\phi_{sst}}$ signals are withdrawn from the SRAM latch activation transistors 138, 122 of the SRAM memory cell 46, thereby releasing the data contained therein. This is followed during time interval 5 by the application of the $\phi_{SE}$ signal of SRAM equalization transistor 134, thereby equalizing the charge stored on the SRAM bit-lines 118, 120 and resulting in a zero voltage potential difference.

Also within time interval 5 the $\phi_{s2}$ and $\overline{\phi}_{s2}$ signals are applied to the sense transistors 108, 86 respectively, thereby boosting the voltage potential difference latched in the sense amplifier 64. During time interval 7, the sense amplifier signals $\phi_{s3}$ and $\overline{\phi}_{s3}$ are applied to respective sense transistors 110, 88 resulting in a further and final boosting of the voltage potential difference between the sense amplifier bit-line 76, 102.

During time interval 8 the SRAM equalization signal $\phi_{SE}$ is removed in preparation for the transfer of the datum to the SRAM memory cell 68. During time interval 9, the $\phi_{TRd}$ signal is applied to the transfer gate transistors 114, 116, thereby permitting them to communicate the respective voltage potentials present on the sense amplifier bit-lines 76, 102 to the SRAM bit-lines 118, 120. Time is provided during time interval 10 to allow the data voltage potential difference to transfer and settle so that, during time interval 11, the reapplication of the $\phi_{sst}$ and $\overline{\phi}_{sst}$ signals to the latch activation transistors 138, 122 results in an immediate latching of the SRAM memory cell 68. Since the activated SRAM cell 68 immediately latches to the corresponding logic state of the sense amplifier 64, there is no possible existence of a DC current path between the SRAM cell 68 and sense-amplifier 64.

Subsequently, during approximately time interval 13, he $\phi_{TRD}$ signal is withdrawn such that the transfer gate transistors 114, 116 again essentially electrical disconnect the sense amplifier 64 from the SRAM memory cell 68. At time interval 14, the word line enable signal $\phi_{W/L}$ is withdrawn followed, during time interval 15 by a withdrawal of all of the sense amplification signals $\phi_{s1}, \overline{\phi}_{s1}, \phi_{s2}, \overline{\phi}_{sw}, \phi_{s3}, \overline{\phi}_{s3}$. This essentially completes the datum transfer.

At some time further subsequent, here shown as during time interval 17, the $\phi_{BLE}$ signal is reapplied to to the sense amplifier equalization transistor 100 resulting in the effective removal of the voltage potential difference between the sense amplifier bit-lines 76, 102. In preparation for the next sense amplification 64 operation, the $\phi_{PC}$ signal is applied, here shown within time 18, to precharge the sense amplifier 64.

Considering now FIG. 3b wherein the timing diagram for a SRAM to DRAM datum transfer is shown, the $\phi_{PC}$ signal is withdrawn during a time interval 1 followed, during a time interval 2, with the withdrawal of the sense amplifier equalization signal $\phi_{BLE}$. Thus, at the beginning of time interval 3, the sense amplifier 64 is fully prepared to begin sensing a datum while, completely isolated therefrom by the transfer gate transistors 114, 116, the SRAM memory cell 68, by the present application of the $\phi_{sst}$ and $\overline{\phi}_{sst}$ signals to the SRAM activavtation transistors 138, 122, is completely active and contains a latched datum for transfer.

To initiate the datum transfer at the beginning of time interval 4, the $\phi$W/L signal is applied to the word line enable transistor 74. During time interval 4, the transfer enable signal $\phi$TRD is provided to the transfer gate transistors 114, 116, thereby transferring the voltage potential difference between the SRAM bit-lines 118, 120 to the respective sense amplifier bit-lines 76, 102 of the sense amplifier 64. During time interval 5, the $\phi$s1, $\overline{\phi}_{s1}$ signals are applied to the respective sense transistors 106, 84 of the sense amplifier 64. The application of the SRAM bit-line voltage potential difference determines the ultimate latched state of the sense amplifier 64, since the charge capacity of the DRAM memory cell capacitor 72 is far less than the charge sourcing capability of the active SRAM memory cell 68. Consequently the corresponding logic states of the sense amplifier bit-lines 76, 102 are directly and firmly established by the respective logic levels of the SRAM bit-lines 118, 120. The logic level corresponding charge stored on the DRAM capacitor 72 is forced to match that of the sense amplifier bit-line 76. Additionally, by the application of the SRAM bit-line voltage potential difference prior to any of the sense amplification signals, the possibility of a DC current path between the sense amplifier 64 and SRAM cell 68 is effectively precluded.

Thus, at this point the data stored by the SRAM memory cell 68 has been effectively transferred to the dynamic RAM memory cell capacitor 72. However, in order to minimize any impact on the sense amplifier timing scheme, the sequential sensing timing of the sense amplifier 64 is permitted to continue. Thus, during time interval 7, the transfer gate signal $\phi_{TRD}$ is withdrawn so as to effectively decouple the sense amplifier 64 from the SRAM memory cell 68 while $\phi_{s2}$ and $\overline{\phi}_{s2}$ are applied to respective sense transistors 108, 86. Again during time interval 9, the sensing signals $\phi_{s3}$ and $\overline{\phi}_{s3}$ are respectively applied to transistors 110 and 88 in completion of the otherwise normal sensing and amplifying timing sequence.

At a subsequent time, here shown as during time interval 15, the write line enable signal $\phi_{W/L}$ is withdrawn followed, in time interval 16, by the withdrawal of the sense signals $\phi_{s1}, \overline{\phi}_{s1}, \phi_{s2}, \overline{\phi}_{s2}, \phi_{s3}, \overline{\phi}_{s3}$. Thereafter, the sense amplifier equalization signal $\phi_{BLE}$ is reapplied, here shown as during time interval 18, immediately followed by the application of the precharge signal $\phi_{PC}$ to prepare the sense amplifier 64 for the next sense amplifier operation.

Thus, a high data capacity dynamic memory array intimately interfaced with a static memory array that provides a high speed access path to the dynamic RAM data while impacting minimally on the sense amplifier timing and dynamic memory redundancy schemes has been described.

It should be understood that the foregoing disclosure relates to the preferred embodiments of the present invention. Many modifications and variations of the present invention are possible in light of the above teachings and may be made therein without departing from the scope and nature of the invention as set forth in the appended claims.

What is claimed is:

1. A dual array memory for storing data subject to the externally addressable input/output transfer of data thereto, said memory comprising:
   (a) first memory array means for dynamically storing data in a plurality of dynamic memory sub-arrays;
   (b) plural array means, respectively coupled to said dynamic memory sub-arrays, for sensing and writing data at addressed locations of said first memory array means;
   (c) second memory array means for statically storing data in a plurality of respective static memory sub-arrays generally corresponding to said plural array means;
   (d) timing and control means for bi-directionally transferring data beween said plural array means and said second memory array means substantially independently of the externally addressable input/output transfer of data to said first memory array means;
   (e) wherein each respective static memory sub-array includes,
      (i) respective latching means for latching data, said latching means operable to latch data only when said latching means is enabled, and
      (ii) respective enabling means, responsive to said timing and control means, for selectably enabling said respective latching means by coupling said latching means to a pair of voltage potentials and for selectably disabling said latching means by substantially decoupling said latching means from the pair of voltage potentials.

2. The memory of claim 1 wherein the externally addressable input/output transfer of data with respect to said first memory array means is substantially independent of the externally input/output transfer of data with respect to said second memory array means.

3. The memory of claim 2 wherein said timing and control means includes means for receiving external addresses for specifying locations within said first memory array means for inter-array data transfer.

4. The memory of claim 3 wherein said plural array means is responsive to said timing and control means for sensing data stored by said second memory array means and for writing corresponding data to said first memory array means.

5. The memory of claim 4 wherein said plural array means is further responsive to said timing and control means for sensing data stored by said first memory array means and for writing corresponding data to externally addressed locations of said second memory array means.

6. The memory of claim 5 further comprising a gate array means for providing switchable data transfer paths between generally respective ones of said plural array means and the respective sub-arrays of said second memory array means, said gate array means being responsive to said timing and control means for selective internal addressing of data locations within said first and second memory array means.

7. The memory of claim 1 wherein each respective latching means further comprises respective means for equalizing said respective latching means to a precharge voltage potential intermediate between the pair of voltage potentials.

8. A dual array memory integrated circuit comprising:
   (a) a static memory array including a plurality of sub-arrays of respective static memory cells;
   (b) an array of sense amplifiers corresponding to said plurality of sub-arrays; and
   (c) an array of transfer gates corresponding to said sense amplifier array, said array of transfer gates respectively interconnecting said respective static memory cells and said sense amplifiers;
   (d) wherein each respective static memory cell comprises a respective data latch cell coupled between respective corresponding first transistors adapted to selectably couple said respective data latch cell between a pair of voltage potentials and decouple said respective data latch cell from the pair of voltage potentials.

9. The integrated circuit of claim 8 wherein each respective static memory cell further comprises at least one respective corresponding second transistor for equalizing charge present within said data latch cell when said respective corresponding first transistors decouple said respective data latch cell from the pair of voltage potentials.

10. The integrated circuit of claim 9 and further comprising timing and control means for selectably enabling said transfer gates, for selectably controlling said respective first transistors and for selectably enabling said at least one respective second transistor of said respective data latch cells.

11. The integrated circuit of claim 8 wherein said timing control means provides for enabling the transfer of data stored in said static memory array to respective sense amplifiers of said sense amplifier array, for sensing of the data provided thereby and for writing corresponding data into the respective sub-arrays of said dynamic memory array.

12. An integrated circuit operating from first and second voltage potentials, said circuit comprising:
   (a) a dynamic memory cell selectably providing a datum on a first bit line;
   (b) a dynamic memory sense amplifier for sensing any datum present on said first bit line and for providing a corresponding datum on said first bit line and a complimentary datum on a second bit line;
   (c) a static memory cell including a data latch for latching a datum on complementary third and fourth bit lines, said data latch being coupled between first and second latch enable transistors further coupled between said first and second voltage potentials, so as to permit decoupling of said data latch from said first and second voltage potentials, said data latch having a charge equalization transistor coupled between said third and fourth bit lines for selectably shorting said third and fourth bit lines together; and
   (d) a pair of transfer gate transistors for selectably interconnecting said first and second bit lines with said third and fourth bit lines, respectively.

13. The integrated circuit of claim 8 wherein each respective data latch cell is adapted to latch data only when said respective corresponding first transistors of each respective cell couple said each respective cell between the pair of voltage potentials.

14. The integrated circuit of claim 1 and further comprising:
   a dynamic memory array including a plurality of respective sub-arrays of dynamic memory cells;

wherein said timing and control means provides for the sensing of data stored in said dynamic memory array and for the transfer of corresponding data to said static memory array while selectably controlling said respective first transistors so as to initially decouple respective data latch cells from the pair of voltage potentials.

15. A method for transferring data between first means for dynamically storing data in a plurality of dynamic memory sub-arrays and second means for statically storing data in a plurality of static memory sub-arrays, each respective static memory sub-array including respective latching means for latching data, each respective latching means coupled between a pair of voltage potentials, said method comprsing the steps of:

decoupling at least one respective latching means from the pair of voltage potnetials, such that data latchhed by the at least one latching means is released;

equalizing charge stored on respective bit lines corresponding to the at least one respective latching means; and recoupling the at lest one respective latching means to the pair of voltage potentials.

16. The method of claim 15 and further comprising the step of:

coupling the first means to the at least one respective latching means substantially after said step of equalizing and before said step of recoupling, such that data is impressed into the at least one respective latching means.

* * * * *